US010833640B2

(12) United States Patent
Hwang (10) Patent No.: US 10,833,640 B2
(45) Date of Patent: Nov. 10, 2020

(54) BUFFER CIRCUIT, CLOCK DIVIDING CIRCUIT INCLUDING THE BUFFER CIRCUIT, AND SEMICONDUCTOR DEVICE INCLUDING THE BUFFER CIRCUIT

(71) Applicant: SK hynix Inc., Gyeonggi-do (KR)

(72) Inventor: Kyu Dong Hwang, Cheongju-si (KR)

(73) Assignee: SK hynix Inc., Gyeonggi-do (KR)

( * ) Notice: Subject to any disclaimer, the term of this patent is extended or adjusted under 35 U.S.C. 154(b) by 71 days.

(21) Appl. No.: 16/170,886

(22) Filed: Oct. 25, 2018

(65) Prior Publication Data

US 2019/0253028 A1  Aug. 15, 2019

(30) Foreign Application Priority Data

Feb. 14, 2018  (KR) .......................... 10-2018-0018506

(51) Int. Cl.
| | | |
|---|---|---|
| *H03F 3/45* | (2006.01) | |
| *H03F 3/345* | (2006.01) | |
| *H03K 5/00* | (2006.01) | |

(52) U.S. Cl.
CPC ......... *H03F 3/45192* (2013.01); *H03F 3/345* (2013.01); *H03K 5/00* (2013.01); *H03F 2200/453* (2013.01); *H03F 2203/45138* (2013.01)

(58) Field of Classification Search
CPC ................. H03F 3/45192; H03F 3/345; H03F 2200/453; H03F 2203/45138; H03K 5/00; H03K 3/0233; H03K 19/018571; H03K 19/017545; H03L 7/18
USPC .................................................. 330/252–261
See application file for complete search history.

(56) References Cited

U.S. PATENT DOCUMENTS

2015/0311875 A1* 10/2015 Chen ...................... G11C 7/065
327/52

FOREIGN PATENT DOCUMENTS

KR  1020160049922 A  5/2016

* cited by examiner

*Primary Examiner* — Khanh V Nguyen
*Assistant Examiner* — Khiem D Nguyen
(74) *Attorney, Agent, or Firm* — William Park & Associates Ltd.

(57) ABSTRACT

A buffer circuit may include: an amplifying circuit configured to change, based on a first input signal and a second input signal, voltage levels of a first output node and a second output node in a range between a first power voltage and a second power voltage; a latch circuit configured to latch the voltage levels of the first output node and the second output node; a first variable load configured to adjust, based on a reset signal, an amount of current provided by a first power voltage terminal at the first power voltage to the first output node; a second variable load configured to adjust, based on the reset signal, an amount of current provided by the first power voltage terminal to the second output node; and a reset circuit configured to drive the first output node to the second power voltage based on the reset signal.

27 Claims, 8 Drawing Sheets

BUFFER CIRCUIT, CLOCK DIVIDING CIRCUIT INCLUDING THE BUFFER CIRCUIT, AND SEMICONDUCTOR DEVICE INCLUDING THE BUFFER CIRCUIT

CROSS-REFERENCES TO RELATED APPLICATION

The present application claims priority under 35 U.S.C. § 119(a) to Korean application number 10-2018-0018506, filed on Feb. 14, 2018, in the Korean Intellectual Property Office, which is incorporated herein by reference in its entirety as set forth in full.

BACKGROUND

1. Technical Field

Various embodiments of the present teachings relate to integrated circuit technology and, more particularly, to a buffer circuit, a clock dividing circuit including the buffer circuit, and a semiconductor device including the buffer circuit.

2. Related Art

Electronic devices have many electronic elements, and computer systems have many semiconductor apparatuses that include semiconductors. Semiconductor apparatuses included in a computer system operate in synchronization with a clock signal. Between two semiconductor apparatuses, as well as between internal circuits in a semiconductor apparatus, various signals are transferred in synchronization with a clock signal. As the operating speed of a computer system increases, the operating speed of a semiconductor apparatus also increases. For example, the frequency of a clock signal becomes greater so that the operating speed of the semiconductor apparatus also increases.

In general, a semiconductor apparatus includes a buffer circuit configured to buffer a clock signal. The buffer circuit performs a buffering operation of receiving and amplifying the clock signal during an activation period. The buffer circuit is reset during a deactivation period. When the buffer circuit is reset, voltage levels of input and output signals of the buffer circuit are not defined. Therefore, when the buffer circuit enters the activation period from the deactivation period, the buffer circuit operates in a quasi-steady state, without accomplishment of expected amplification, and generates an output signal having an opposite phase to a target phase. As the frequency of a clock signal becomes greater, such problem become serious.

SUMMARY

In accordance with the present teachings, a buffer circuit may include an amplifying circuit configured to change, based on a first input signal and a second input signal, voltage levels of a first output node and a second output node in a range between a first power voltage and a second power voltage. The buffer circuit may further include a latch circuit configured to latch the voltage levels of the first output node and the second output node. The buffer circuit may additionally include a first variable load, configured to adjust, based on a reset signal, an amount of current provided by a first power voltage terminal at the first power voltage to the first output node and a second variable load configured to adjust, based on the reset signal, an amount of current provided by the first power voltage terminal to the second output node. The buffer circuit also includes a reset circuit configured to drive the first output node to the second power voltage based on the reset signal.

Further in accordance with the present teachings, a buffer circuit may include an amplifying circuit configured to change, based on a first input signal and a second input signal, voltage levels of a first output node and a second output node in a range between a first power voltage and a second power voltage. The buffer circuit may include a latch circuit configured to latch the voltage levels of the first output node and the second output node. The buffer circuit may further include a first variable load coupled between a first power voltage terminal at the first power voltage and the first output node, wherein a resistance value of the first variable load varies based on a reset signal and a second variable load coupled between the first power voltage terminal and the second output node, wherein a resistance value of the second variable load varies based on the reset signal. The buffer circuit may additionally include a reset circuit configured to drive the first output node to the second power voltage based on the reset signal.

Also in accordance with the present teachings, a buffer circuit may include an amplifying circuit configured to change, based on a first input signal and a second input signal, voltage levels of a first output node and a second output node in a range between a first power voltage and a second power voltage. The buffer circuit may further include a latch circuit configured to latch the voltage levels of the first output node and the second output node. The buffer circuit may additionally include a first variable load configured to adjust, based on a first reset signal and a second reset signal, an amount of current provided by a first power voltage terminal at the first power voltage to the first output node and a second variable load configured to adjust, based on the first reset signal and a third reset signal, an amount of current provided by the first power voltage terminal to the second output node. The buffer circuit may also include a reset circuit configured to drive the first output node to the second power voltage based on the second reset signal.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

A semiconductor apparatus according to the present teachings is described below with reference to the accompanying drawings illustrating various embodiments.

Figure 1:
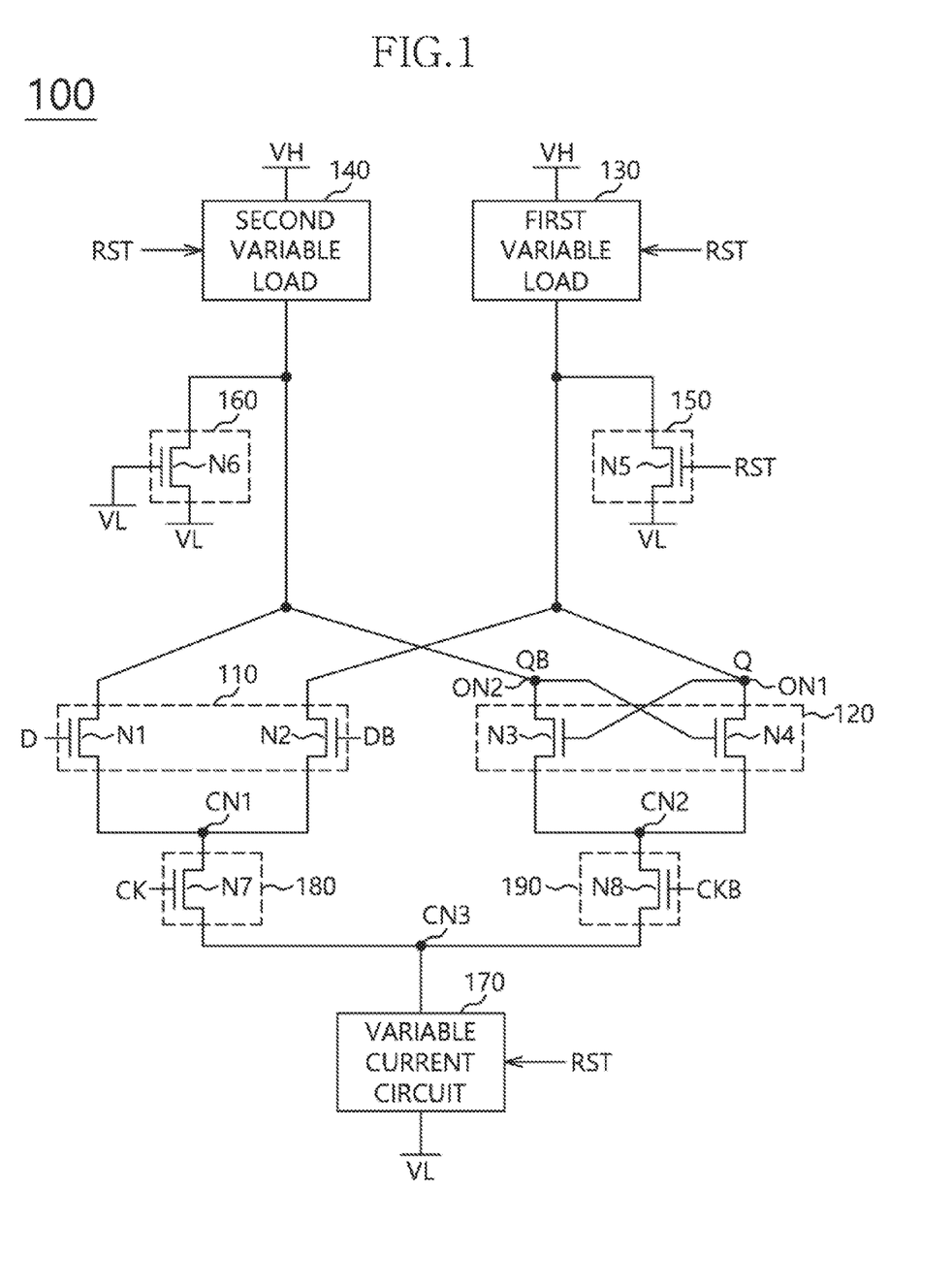
FIG. 1 shows a diagram illustrating a configuration of a buffer circuit, in accordance with an embodiment of the present disclosure.

FIG. 1 shows a diagram illustrating a configuration of a buffer circuit 100, in accordance with an embodiment of the present disclosure. Referring to FIG. 1, the buffer circuit 100 may receive a first input signal D and a second input signal DB and may generate a first output signal Q and a second output signal QB. The buffer circuit 100 may change voltage levels of a first output node ON1 and a second output node ON2 and latch the voltage levels of the first output node ON1 and the second output node ON2 based on the first input signal D and the second input signal DB. The first output signal Q may be output from the first output node ON1, and the second output signal QB may be output from the second output node ON2. During an activation period, the buffer circuit 100 may change the voltage levels of the first output node ON1 and the second output node ON2 and latch the voltage levels of the first output node ON1 and the second output node ON2 by amplifying the first input signal D and the second input signal DB. During a deactivation period and/or a reset period, the buffer circuit 100 may be reset. In the reset period, the buffer circuit 100 may keep the first output node ON1 and the second output node ON2 having different voltage levels with minimized power consumption. The buffer circuit 100 may receive a reset signal RST and may be reset based on the reset signal RST. The buffer circuit 100 may further receive a clock signal CK. The buffer circuit 100 may perform an amplification operation and a latch operation in synchronization with the dock signal CK. For example, while the clock signal CK has a first level, the buffer circuit 100 may change the voltage levels of the first output node ON1 and the second output node ON2 by amplifying the first input signal D and the second input signal DB. While the clock signal CK has a second level, the buffer circuit 100 may keep the voltage levels of the first output node ON1 and the second output node ON2.

The buffer circuit 100 may include an amplifying circuit 110, a latch circuit 120, a first variable load 130, a second variable load 140, and a reset circuit 150. The amplifying circuit 110 may receive the first input signal D and the second input signal DB and may change the voltage levels of the first output node ON1 and the second output node ON2 based on the first input signal D and the second input signal DB. For an embodiment, the second input signal DB may be a complementary signal of the first input signal D. The amplifying circuit 110 may be coupled between a first power voltage VH terminal and a second power voltage VL terminal to receive a first power voltage VH and a second power voltage VL, respectively. The first power voltage VH may have a high voltage level and the second power voltage VL may have a lower voltage level than the first power voltage VH. The amplifying circuit 110 may change the voltage levels of the first output node ON1 and the second output node ON2 in a range between the first power voltage VH and the second power voltage VL based on the first input signal D and the second input signal DB.

The latch circuit 120 may latch the voltage levels of the first output node ON1 and the second output node ON2. The latch circuit 120 may perform the latch operation to keep the voltage levels of the first output node ON1 and the second output node ON2.

The first variable load 130 may be coupled between the first power voltage VH terminal and the first output node ON1. The first variable load 130 may change an amount of current provided from the first power voltage VH terminal to the first output node ON1 based on the reset signal RST. The first variable load 130 may have a variable resistance value based on the reset signal RST.

The second variable load 140 may be coupled between the first power voltage VH terminal and the second output node ON2. The second variable load 140 may change an amount of current provided from the first power voltage VH terminal to the second output node ON2 based on the reset signal RST. The second variable load 140 may have a variable resistance value based on the reset signal RST.

In an embodiment, amounts of current provided from the first variable load 130 and the second variable load 140 to the first output node ON1 and the second output node ON2, respectively, may be the same as each other during the reset period. During the reset period, the first variable load 130 and the second variable load 140 may have the same resistance value. In an embodiment, amounts of current provided from the first variable load 130 and the second variable load 140 to the first output node ON1 and the second output node ON2, respectively, may be different from each other during the reset period. For example, the amount of current provided from the second variable load 140 to the second output node ON2 may be greater than the amount of current provided from the first variable load 130 to the first output node ON1 during the reset period. During the reset period, the first variable load 130 and the second variable load 140 may have different resistance values from each other. For example, the first variable load 130 may have greater resistance value than the second variable load 140 during the reset period. Outside the reset period, the first variable load 130 and the second variable load 140 may provide the same amount of current to the first output node ON1 and the second output node ON2, respectively, and may have the same resistance value. The amounts of current provided from the first variable load 130 and the second variable load 140 to the first output node ON1 and the second output node ON2, respectively, outside the reset period may be greater than the amount of current provided from the first variable load 130 to the first output node ON1 or the amount of current provided from the second variable load 140 to the second output node ON2 during the reset period. The resistance values of the first variable load 130 and the second variable load 140 outside the reset period may be less than the resistance value of the first variable load 130 or the resistance value of the second variable load 140 during the reset period. "Outside the reset period", as used herein, means at a time other than a time within the reset period.

For various embodiments, two quantities being the same implies the quantities are substantially the same. Two quantities being substantially the same means that someone of skill in the art would regard the quantities as being effectively the same for purposes of practicing the present teachings given that the two quantities may not be precisely the same due to manufacturing and operational variances or tolerances of components involved in determining or generating the two quantities.

Each of the first variable load 130 and the second variable load 140 may receive the reset signal RST. The first variable load 130 may provide a first current to the first output node ON1 while the reset signal RST is disabled. The first variable load 130 may provide a second current to the first output node ON1 while the reset signal RST is enabled. The first current may be greater than the second current. The second variable load 140 may provide the first current to the second output node ON2 while the reset signal RST is disabled. The second variable load 140 may provide a third current to the second output node ON2 while the reset signal RST is enabled. The third current may be the same as or greater than the second current and may be less than the first current. The first variable load 130 may have a first resistance value while the reset signal RST is disabled and may have a second resistance value while the reset signal RST is enabled. The first resistance value may be less than the second resistance value. The second variable load 140 may have the first resistance value while the reset signal RST is disabled and may have a third resistance value while the reset signal RST is enabled. The third resistance value may be the same as or less than the second resistance value and may be greater than the first resistance value.

The reset circuit 150 may receive the reset signal RST and may drive the first output node ON1 to the second power voltage VL based on the reset signal RST. The reset circuit 150 may drive the first output node ON1 to the second power voltage VL while the reset signal RST is enabled. The reset circuit 150 may be turned off while the reset signal RST is disabled. The buffer circuit 100 may further include a dummy circuit 160. The dummy circuit 160 may be coupled to the second output node ON2, and may correspond to the location of the reset circuit 150, as shown. The dummy circuit 160 may stay turned off regardless of the reset period. The dummy circuit 160 may have the same loading as the reset circuit 150. For example, a resistance value of the dummy circuit 160 may be the same as the off-resistance value of the reset circuit 150.

The buffer circuit 100 may also include a variable current circuit 170, a first enabling circuit 180, and a second enabling circuit 190. The variable current circuit 170 may be coupled between the amplifying circuit 110, the latch circuit 120, and the second power voltage VL terminal, as shown. The variable current circuit 170 may receive the reset signal RST. The variable current circuit 170 may adjust the amount of current flowing from the amplifying circuit 110 and the latch circuit 120 to the second power voltage VL terminal based on the reset signal RST. The variable current circuit 170 may control a fourth current to flow from the amplifying circuit 110 and the latch circuit 120 to the second power voltage VL terminal while the reset signal RST is disabled. The variable current circuit 170 may control a fifth current to flow from the amplifying circuit 110 and the latch circuit 120 to the second power voltage VL terminal while the reset signal RST is enabled. The fourth current may be greater than the fifth current.

The first enabling circuit 180 may receive the clock signal CK. The first enabling circuit 180 may provide the second power voltage VL to the amplifying circuit 110 based on the clock signal CK. The first enabling circuit 180 may couple the amplifying circuit 110 to the variable current circuit 170 based on the clock signal CK. For example, the first enabling circuit 180 may provide the second power voltage VL to the amplifying circuit 110 by coupling the amplifying circuit 110 to the variable current circuit 170 during a high-level period of the clock signal CK. The first enabling circuit 180 may be turned off during a low-level period of the clock signal CK. The second enabling circuit 190 may receive a complementary clock signal CKB to the clock signal CK.

The second enabling circuit 190 may provide the second power voltage VL to the latch circuit 120 based on the complementary clock signal CKB. The second enabling circuit 190 may couple the latch circuit 120 to the variable current circuit 170 based on the complementary clock signal CKB. For example, the second enabling circuit 190 may provide the second power voltage VL to the latch circuit 120 by coupling the latch circuit 120 to the variable current circuit 170 during the high-level period of the complementary clock signal CKB. The second enabling circuit 190 may be turned off during the low-level period of the complementary clock signal CKB.

Referring to FIG. 1, the amplifying circuit 110 may include a first transistor N1 and a second transistor N2. The first transistor N1 and the second transistor N2 may be N-type channel MOS transistors. FIG. 1 shows the amplifying circuit 110 as an N-type amplifying circuit, but the amplifying circuit 110 may be implemented as a P-type amplifying circuit. The first transistor N1 may receive the first input signal D at its gate, may be coupled to the second output node ON2 at its drain, and may be coupled to a first common node CN1 at its source. The second transistor N2 may receive the second input signal DB at its gate, may be coupled to the first output node NO1 at its drain, and may be coupled to the first common node CN1 at its source. The latch circuit 120 may include a third transistor N3 and a fourth transistor N4. The third transistor N3 and the fourth transistor N4 may be N-type channel MOS transistors. FIG. 1 shows the latch circuit 120 as an N-type latch circuit, but the latch circuit 120 may be implemented as a P-type latch circuit. The third transistor N3 may be coupled to the first output node NO1 at its gate, may be coupled to the second output node ON2 at its drain, and may be coupled to a second common node CN2 at its source. The fourth transistor N4 may be coupled to the second output node ON2 at its gate, may be coupled to the first output node NO1 at its drain, and may be coupled to the second common node CN2 at its source.

The reset circuit 150 may include a fifth transistor N5. The fifth transistor N5 may be an N-type channel MOS transistor. The fifth transistor N5 may receive the reset signal RST at its gate, may be coupled to the first output node ON1 and the first variable load 130 at its drain, and may receive the second power voltage VL at its source. The fifth transistor N5 may drive the first output node ON1 to the second power voltage VL in response to the reset signal RST enabled to a high level. In an embodiment, the reset circuit 150 may be implemented with a P-type channel MOS transistor operating in response to the reset signal RST enabled to a low level. The dummy circuit 160 may include a sixth transistor N6. The sixth transistor N6 may be an N-type channel MOS transistor. The sixth transistor N6 may receive the second power voltage VL at its gate, may be coupled to the second output nose ON2 and the second variable load 140 at its drain, and may receive the second power voltage VL at its source. The sixth transistor N6 may keep turned off by receiving the second power voltage VL. In an embodiment, the dummy circuit 160 may be implemented with a P-type channel MOS transistor receiving the first power voltage VH.

Referring to FIG. 1, the first enabling circuit 180 may include a seventh transistor N7, and the second enabling circuit 190 may include an eighth transistor N8. The seventh transistor N7 and the eighth transistor N8 may be N-type channel MOS transistors. The seventh transistor N7 may receive the clock signal CK at its gate and may be coupled to the first common node CN1 at its drain. The seventh transistor N7 may be coupled to a third common node CN3 at its source and may be coupled to the variable current circuit 170 through the third common node CN3. The eighth transistor N8 may receive the complementary clock signals CKB at its gate and may be coupled to the second common node CN2 at its drain. The eighth transistor N8 may be coupled to the third common node CN3 at its source and may be coupled to the variable current circuit 170 through the third common node CN3.

During an activated period of the buffer circuit 100, the reset signal RST may be disabled. The first variable load 130 and the second variable load 140 may have the same resistance value and may provide the same amount of current to the first output node ON1 and the second output node ON2, respectively, as each other. The first variable load 130 and the second variable load 140 may have the smallest resistance value and may correspondingly provide the greatest amount of current to the first output node ON1 and the second output node ON2, respectively. The variable current circuit 170 may control the greatest amount of current to flow from the third common node CN3 to the second power voltage VL terminal in response to the disabled reset signal RST. During the high-level period of the clock signal CK, the first transistor N1 and the second transistor N2 may be selectively turned on based on the first input signal D and the second input signal DB and may differentially change the voltage levels of the first and second output nodes ON1 and ON2. For example, when the first input signal D has a high level and the second input signal DB has a low level, the first transistor N1 may be turned on and the second transistor N2 may be turned off. Therefore, the first output node ON1 may have a voltage level corresponding to a high level, and the second output node ON2 may have a voltage level corresponding to a low level. During the high-level period of the complementary clock signal CKB, the third transistor N3 and the fourth transistor N4 may keep the voltage levels of the first output node ON1 and the second output node ON2 based on the voltage levels of the first output node ON1 and the second output node ON2. For example, when the first output node ON1 has a high level and the second output node ON2 has a low level, the third transistor N3 may be turned on and the fourth transistor N4 may be turned off. Therefore, the second output signal QB output form the second output node ON2 may be kept to have a low level, and a third output signal Q output from the first output node ON1 may be kept to have a high level.

During a reset period of the buffer circuit 100, the reset signal RST may be enabled. The first variable load 130 and the second variable load 140 may have the same resistance value or different resistance values. The resistance values of the first variable load 130 and the second variable load 140 during the reset period may be greater than the resistance values of the first variable load 130 and the second variable load 140 outside the reset period. Therefore, the amount of current provided from the first variable load 130 and the second variable load 140 to the first output node ON1 and the second output node ON2, respectively, may be decreased. The variable current circuit 170 may control the least amount of current to flow from the third common node CN3 to the second power voltage VL terminal in response to the enabled reset signal RST. Therefore, the current path of the buffer circuit 100 may be minimized and the power consumption of the buffer circuit 100 may be reduced.

The reset circuit 150 may drive the first output node ON1 to the second power voltage VL in response to the enabled reset signal RST. Therefore, the second output node ON2 may have a relatively high voltage level, and the first output node ON1 may have a voltage level corresponding to the second power voltage VL. When the buffer circuit 100 again enters the activated period in the case that the first output node ON1 and the second output node ON2 have the same voltage level as each other or have little difference in their voltage levels in the reset period, the buffer circuit 100 cannot differentially amplify the first input signal D and the second input signal DB, and the first output signal Q and the second output signal QB of the buffer circuit 100 may have a quasi-steady state. In accordance with an embodiment of the present disclosure, the buffer circuit 100 may keep the first output node ON1 and the second output node ON2 having a predetermined voltage level difference in the reset period. Therefore, when the buffer circuit 100 again enters the activated period, the buffer circuit 100 may generate the first output signal Q and the second output signal QB having correct voltage levels according to the first input signal D and the second input signal DB. Also, the amount of current provided from the first variable load 130 to the first output node ON1 may become least, and thus the drivability of the reset circuit 150 for driving the first output node ON1 to the second power voltage VL may also become least. Therefore, the fifth transistor N5 may have a small size and an area for the buffer circuit 100 may be reduced as much.

Figure 2:
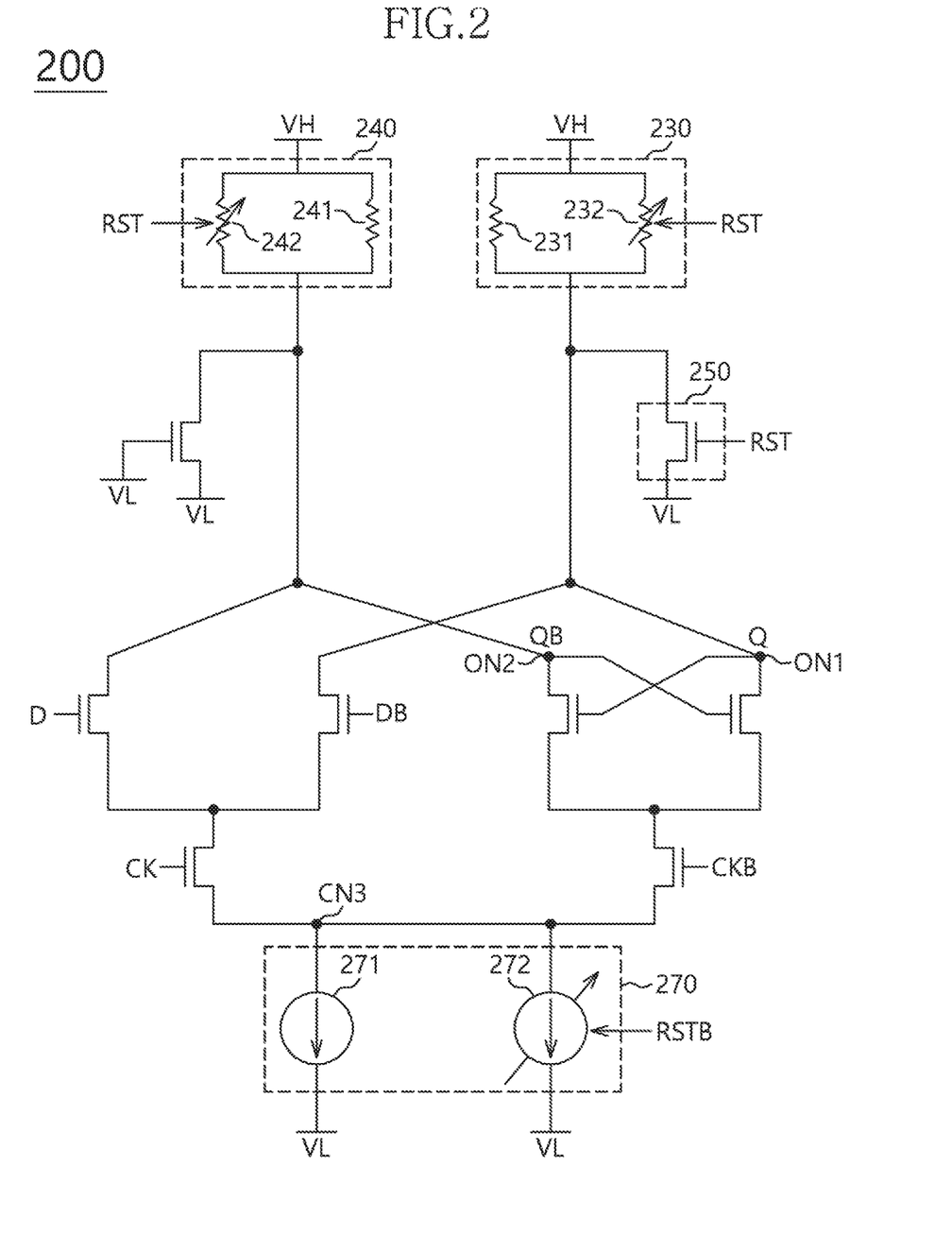
FIG. 2 shows a diagram illustrating a configuration of a buffer circuit, in accordance with an embodiment of the present disclosure.

FIG. 2 shows a diagram illustrating a configuration of a buffer circuit 200, in accordance with an embodiment of the present disclosure. Referring to FIG. 2, the buffer circuit 200 may be applied as the buffer circuit 100 of FIG. 1, and common elements are not described again here. The buffer circuit 200 may include a first variable load 230, a second variable load 240, and a variable current circuit 270. The first variable load 230 may include a first fixed resistance 231 and a first variable resistance 232. The first fixed resistance 231 and the first variable resistance 232 may be coupled in parallel between the first power voltage VH terminal and the first output node ON1. The resistance value of the first variable resistance 232 may vary based on the reset signal RST. The first variable resistance 232 may have a relatively small resistance value while the reset signal RST is disabled and may have a relatively great resistance value while the reset signal RST is enabled.

The second variable load 240 may include a second fixed resistance 241 and a second variable resistance 242. The second fixed resistance 241 and the second variable resistance 242 may be coupled in parallel between the first power voltage VH terminal and the second output node ON2. The resistance value of the second variable resistance 242 may vary based on the reset signal RST. The second variable resistance 242 may have a relatively small resistance value while the reset signal RST is disabled and may have a relatively great resistance value while the reset signal RST is enabled.

While the reset signal RST is disabled, the resistance values of the first variable load 230 and the second variable load 240 may be the same. The resistance values of the first variable load 230 and the second variable load 240 while the reset signal RST is enabled may be greater than the resistance values of the first variable load 230 and the second variable load 240 while the reset signal RST is disabled, respectively. While the reset signal RST is disabled, the resistance value of the first variable load 230 may be the same as or less than the resistance value of the second variable load 240. While the reset signal RST is disabled, the first variable load 230 and the second variable load 240 have relatively great resistance values and thus the amount of current provided from the first power voltage VH terminal to the first output node ON1 and the second output node ON2 may be reduced.

The variable current circuit 270 may include a fixed current source 271 and a variable current source 272. The fixed current source 271 and the variable current source 272 may be coupled in parallel between the third common node CN3 and the second power voltage VL terminal. The fixed current source 271 may control a predetermined amount of current to keep flowing from the third common node CN3 to the second power voltage VL terminal. The variable current source 272 may adjust the current flowing from the third common node CN3 to the second power voltage VL terminal based on the reset signal RST. For example, the variable current source 272 may receive a complementary signal RSTB of the reset signal RST. The variable current source 272 may control a relatively great amount of current to flow from the third common node CN3 to the second power voltage VL terminal while the reset signal RST is disabled. The variable current source 272 may control a relatively small amount of current to flow from the third common node CN3 to the second power voltage VL terminal while the reset signal RST is enabled. In an embodiment, the variable current source 272 may be turned off and the current may flow only through the fixed current source 271 while the reset signal RST is disabled. Due to the first variable load 230, the second variable load 240, and the variable current circuit 270, the power consumption of the buffer circuit 200 may be minimized while the reset signal RST is enabled, and an area of a reset circuit 250 may be reduced.

Figure 3:
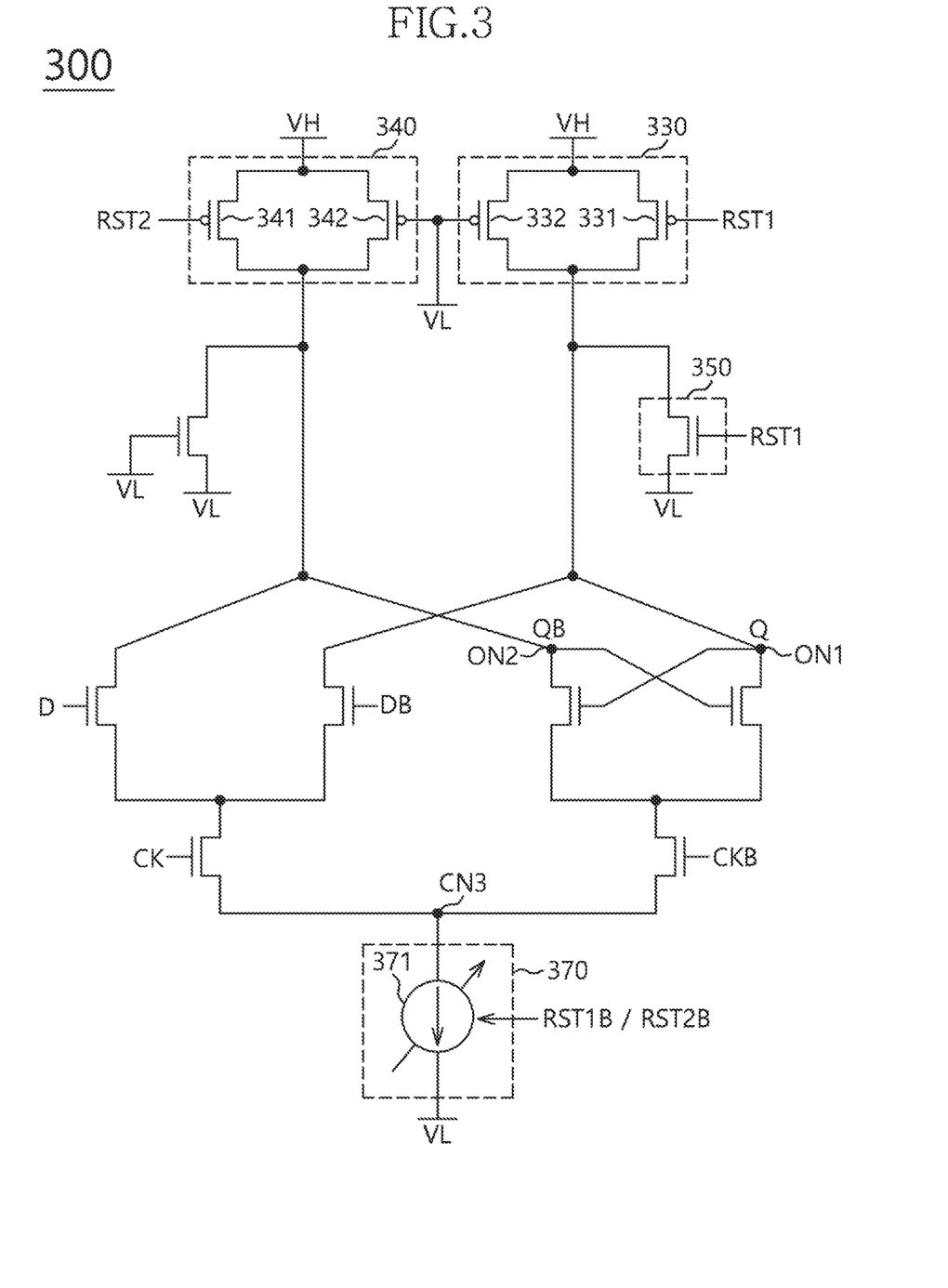
FIG. 3 shows a diagram illustrating a configuration of a buffer circuit, in accordance with an embodiment of the present disclosure.

FIG. 3 shows a diagram illustrating a configuration of a buffer circuit 300, in accordance with an embodiment of the present disclosure. Referring to FIG. 3, the buffer circuit 300 may be applied as the buffer circuit 100 of FIG. 1, and common elements are not described again here. The buffer circuit 300 may include a first variable load 330, a second variable load 340, a reset circuit 350, and a variable current circuit 370. The first variable load 330 may include a first transistor 331 and a second transistor 332. The first transistor 331 and the second transistor 332 may be P-type channel MOS transistors. The first transistor 331 may receive a first reset signal RST1 at its gate, may be coupled to the first power voltage VH terminal at its source, and may be coupled to the first output node ON1 at its drain. The second transistor 332 may receive the second power voltage VL at its gate, may be coupled to the first power voltage VH terminal at its source, and may be coupled to the first output node ON1 at its drain.

The second variable load 340 may include a third transistor 341 and a fourth transistor 342. The third transistor 341 and the fourth transistor 342 may be P-type channel MOS transistors. The third transistor 341 may receive a second reset signal RST2 at its gate, may be coupled to the first power voltage VH terminal at its source, and may be coupled to the second output node ON2 at its drain. The fourth transistor 342 may receive the second power voltage VL at its gate, may be coupled to the first power voltage VH terminal at its source, and may be coupled to the second output node ON2 at its drain. The second reset signal RST2 may be generated from the first reset signal RST1. For example, the second reset signal RST2 may have the same voltage level or a lower voltage level than the first reset signal RST1.

The reset circuit 350 may receive the first reset signal RST1. The reset circuit 350 may drive the first output node ON1 to the second power voltage VL based on the first reset signal RST1.

The second transistor 332 and the fourth transistor 342 may have the same size and the same turn-on resistance value as each other. The second transistor 332 and the fourth transistor 342 may receive the second power voltage VL at their gates, and thus the second transistor 332 and the fourth transistor 342 may be always turned on and may work as fixed resistances. The first transistor 331 and the third transistor 341 may have the same size and the same turn-on resistance value as each other. The first transistor 331 and the third transistor 341 may receive the first reset signal RST1 and the second reset signal RST2, respectively, and thus, the first transistor 331 and the third transistor 341 may be turned on based on the first reset signal RST1 and the second reset signal RST2, respectively, and may work as variable resistances. While the first reset signal RST1 and the second reset signal RST2 are enabled and have the same voltage level as each other, the resistance values of the first variable load 330 and the second variable load 340 may be the same as each other. While the first reset signal RST1 and the second reset signal RST2 are enabled and the second reset signal RST2 has a lower voltage level than the first reset signal RST1, the first transistor 331 may be completely turned off and the third transistor 341 may be partly turned on. Therefore, the first variable load 330 may have a greater resistance value than the second variable load 340. The third transistor 341 may control the current to flow from the first power voltage VH terminal to the second output node ON2, while the first transistor 331 may control the current not to flow from the first power voltage VH terminal to the first output node ON1.

The variable current circuit 370 may include a variable current source 371. The variable current source 371 may be coupled between the third common node CN3 and the second power voltage VL terminal. The variable current source 371 may adjust the amount of current flowing from the third common node CN3 to the second power voltage VL terminal based on at least one of between the first reset signal RST1 and the second reset signal RST2. For example, the variable current source 371 may receive at least one of between a complementary signal RST1B of the first reset signal RST1 and a complementary signal RST2B of the second reset signal RST2. For example, while the first reset signal RST1 and the second reset signal RST2 are disabled, the variable current source 371 may control a relatively great amount of current to flow. While the first reset signal RST1 and the second reset signal RST2 are enabled, the variable current source 371 may control a relatively small amount of current to flow. In an embodiment, the variable current source 371 may be turned off and may cut off the current flowing from the third common node CN3 to the second power voltage VL terminal based on at least one of between the complementary signal RST1B of the first reset signal RST1 and the complementary signal RST2B of the second reset signal RST2.

Figure 4:
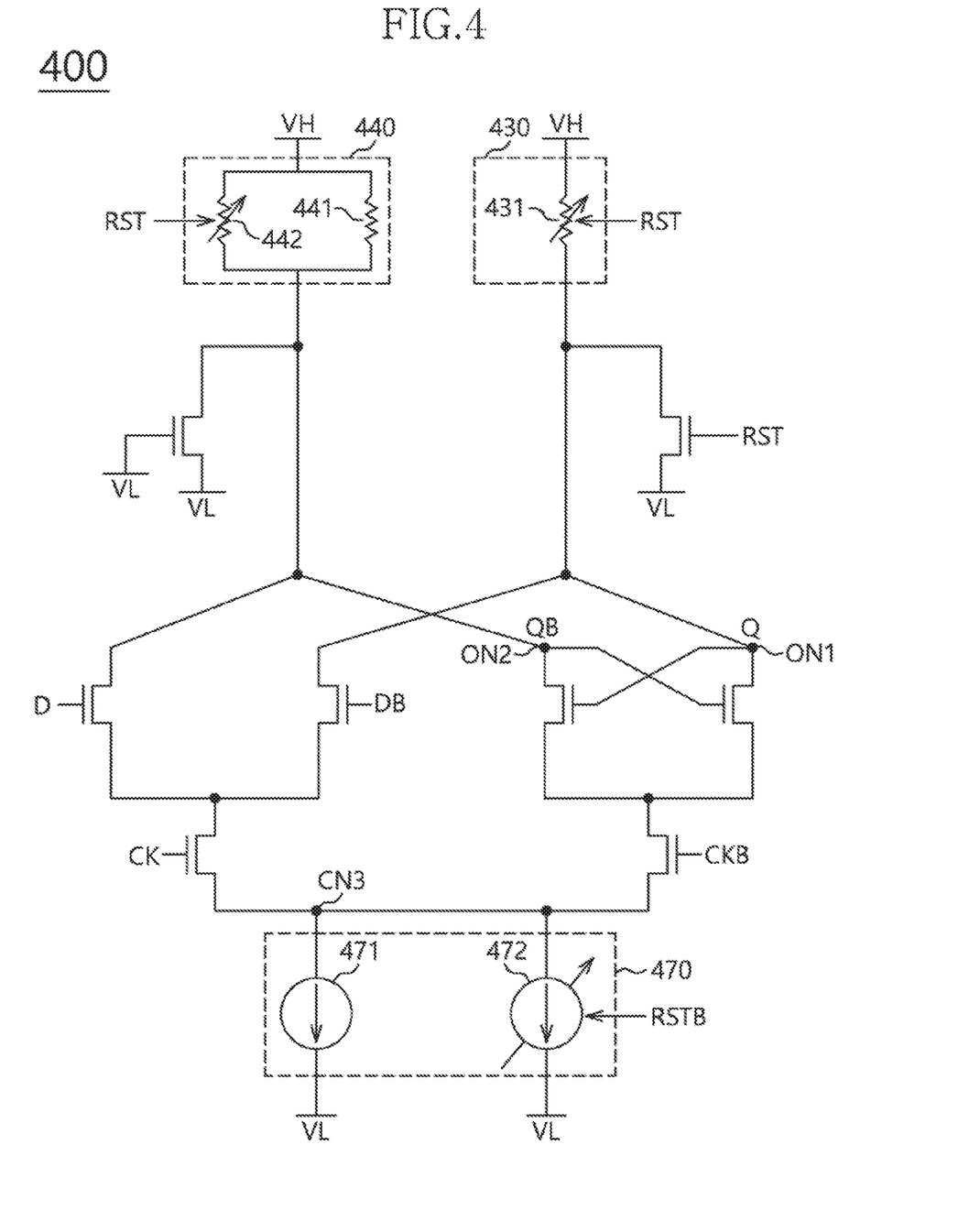
FIG. 4 shows a diagram illustrating a configuration of a buffer circuit, in accordance with an embodiment of the present disclosure.

FIG. 4 shows a diagram illustrating a configuration of a buffer circuit 400, in accordance with an embodiment of the present disclosure. Referring to FIG. 4, the buffer circuit 400 may be applied as the buffer circuit 100 of FIG. 1, and common elements are not described again here. The buffer circuit 400 may include a first variable load 430, a second variable load 440, and a variable current circuit 470. The first variable load 430 may include a first variable resistance 431. The first variable resistance 431 may be coupled between the first power voltage VH terminal and the first output node ON1. The resistance value of the first variable resistance 431 may vary based on the reset signal RST. The first variable resistance 431 may have a relatively small resistance value while the reset signal RST is disabled and may have a relatively great resistance value while the reset signal RST is enabled. The second variable load 440 may include a fixed resistance 441 and a second variable resistance 442. The fixed resistance 441 and the second variable resistance 442 may be coupled in parallel between the first power voltage VH terminal and the second output node ON2. The resistance value of the second variable resistance 442 may vary based on the reset signal RST. The second variable resistance 442 may have a relatively small resistance value while the reset signal RST is disabled and may have a relatively great resistance value while the reset signal RST is enabled.

While the reset signal RST is disabled, the resistance values of the first variable load 430 and the second variable load 440 may be the same as each other. The resistance value of the second variable load 440 may be less than the resistance value of the first variable load 430 while the reset signal RST is enabled. For example, while the reset signal RST is enabled, the first variable resistance 431 and the second variable resistance 442 may have much great resistance values and may cut off the current flowing from the first power voltage VH terminal to the first output node ON1 and the second output node ON2. While the reset signal RST is enabled, the current might not flow from the first power voltage VH terminal to the first output node ON1 through the first variable load 430 while the current may flow from the first power voltage VH terminal to the first output node ON1 through the fixed resistance 441 of the second variable load 440. Therefore, the second output node ON2 may have a relatively high voltage level, and the first output signal Q generated from the first output node ON1 and the second output signal QB generated from the second output node ON2 may have a predetermined voltage level difference.

The variable current circuit 470 may include a fixed current source 471 and a variable current source 472. The fixed current source 471 and the variable current source 472 may be coupled in parallel between the third common node CN3 and the second power voltage VL terminal. The fixed current source 471 may control a predetermined amount of current to keep current flowing from the third common node CN3 to the second power voltage VL terminal. The variable current source 472 may adjust the current flowing from the third common node CN3 to the second power voltage VL terminal based on the reset signal RST. For example, the variable current source 472 may receive a complementary signal RSTB of the reset signal RST. The variable current source 472 may control a relatively great amount of current to flow from the third common node CN3 to the second power voltage VL terminal while the reset signal RST is disabled. The variable current source 472 may control a relatively small amount of current to flow from the third common node CN3 to the second power voltage VL terminal while the reset signal RST is enabled. In an embodiment, the variable current source 472 may be turned off and the current may flow only through the fixed current source 471 while the reset signal RST is disabled. The embodiments of the buffer circuits 200, 300, and 400 of FIGS. 2, 3, and 4, respectively, might not be independent from one another and may be modified such that one may be combined with another among the embodiments of the buffer circuits 200, 300 and 400.

Figure 5:
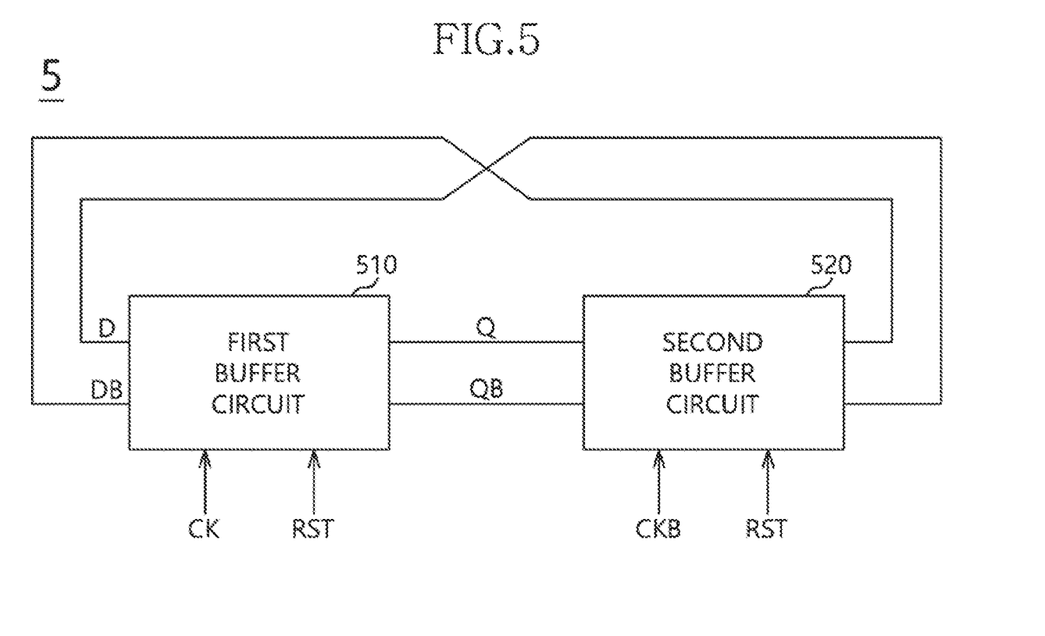
FIG. 5 shows a diagram illustrating a configuration of a clock dividing circuit, in accordance with an embodiment of the present disclosure.

FIG. 5 shows a diagram illustrating a configuration of a clock dividing circuit 5, in accordance with an embodiment of the present disclosure. Referring to FIG. 5, the clock dividing circuit 5 may include a first buffer circuit 510 and a second buffer circuit 520. The first buffer circuit 510 may have substantially the same configuration as the second buffer circuit 520. One of the buffer circuits 100, 200, 300, and 400 may be applied between the first buffer circuit 510 and the second buffer circuit 520. The first buffer circuit 510 may receive the first input signal D and the second input signal DB and may generate the first output signal Q and the second output signal QB. The first buffer circuit 510 may perform an amplification operation and a latch operation in synchronization with the clock signal CK. For example, when the clock signal CK has a high level, the first buffer circuit 510 may generate the first output signal Q and the second output signal QB by amplifying the first input signal D and the second input signal DB. While the clock signal CK has a low level, the first buffer circuit 510 may keep the voltage levels of the first output signal Q and the second output signal QB. The first output signal Q and the second output signal QB may be a pair of divided clock signals, which are divided from the clock signal CK. The second buffer circuit 520 may receive the first output signal Q and the second output signal QB and may generate the first input signal D and the second input signal DB.

The second buffer circuit 520 may perform an amplification operation and a latch operation in synchronization with the complementary clock signal CKB. For example, when the complementary clock signal CKB has a high level, the second buffer circuit 520 may generate the first input signal D and the second input signal DB by amplifying the first output signal Q and the second output signal QB. While the complementary clock signal CKB has a low level, the second buffer circuit 520 may keep the voltage levels of the first input signal D and the second input signal DB.

Each of the first buffer circuit 510 and the second buffer circuit 520 may receive the reset signal RST and may be reset while the reset signal RST is enabled. The first buffer circuit 510 may minimize the power consumption thereof and may make the first output signal Q and the second output signal QB have a predetermined voltage level difference based on the reset signal RST. The second buffer circuit 520 may minimize the power consumption thereof and may make the first input signal D and the second input signal DB have a predetermined voltage level difference based on the reset signal RST. When the reset signal RST is disabled and the first buffer circuit 510 and the second buffer circuit 520 are activated, the first input signal D and the second input signal DB may have a predetermined voltage level difference and the first output signal Q and the second output signal QB may have a predetermined voltage level difference and thus the first buffer circuit 510 and the second buffer circuit 520 may generate a pair of divided clocks in synchronization with the clock signals CK.

Figure 6A:
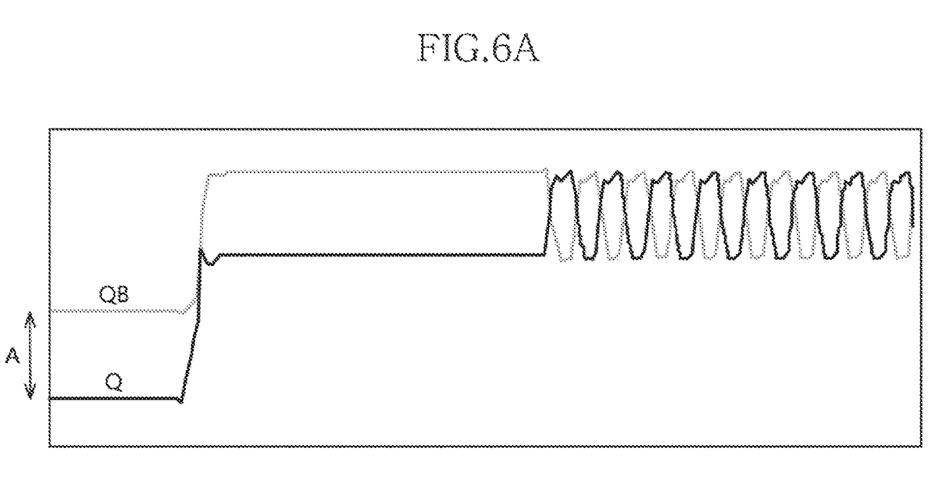
FIGS. 6A and 6B show timing diagrams illustrating an operation of a buffer circuit, in accordance with an embodiment of the present disclosure.
Figure 6B:
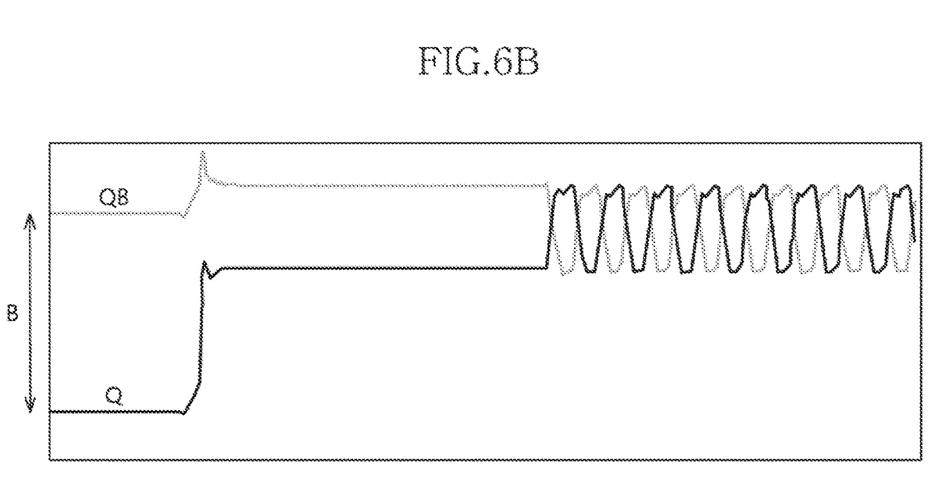

FIGS. 6A and 6B show timing diagrams illustrating an operation of the buffer circuit 100, in accordance with an embodiment of the present disclosure. Specifically, FIG. 6A shows a timing diagram when the first variable load 130 and the second variable load 140 have the same resistance value while the reset signal RST is enabled, such as for the buffer circuits 200 and 300 described with reference to FIGS. 2 and 3, respectively. FIG. 6B shows a timing diagram when the second variable load 140 has less resistance value than the first variable load 130 while the reset signal RST is enabled, such as for the buffer circuit 400 described with reference to FIG. 4.

Referring to FIGS. 1 and 6A, during the reset period of the buffer circuit 100, the first variable load 130 and the second variable load 140 may provide the same amount of current to the first output node ON1 and the second output node ON2, respectively, and the reset circuit 150 may drive the first output node ON1 to the second power voltage VL. Therefore, the first output signal Q and the second output signal QB may have the voltage level difference corresponding to 'A.' After that, when the buffer circuit 100 enters the activated period, the amounts of current that the first variable load 130 and the second variable load 140 provide to the first output node ON1 and the second output node ON2, respectively, may increase, and the amount of current flowing through the variable current circuit 170 may also increase. Therefore, the voltage levels of the first output signal Q and the second output signal QB may increase while keeping the voltage level difference corresponding to the swing range of the buffer circuit 100. After that, when the clock signal CK is input to the buffer circuit 100, the first output signal Q and the second output signal QB may be differentially amplified and toggled in synchronization with the clock signal CK while not being in the quasi-steady state.

As illustrated in FIG. 6B, when the second variable load 140 has a less resistance value than the first variable load 130, the first output signal Q and the second output signal QB may have the voltage level difference corresponding to 'B,' which is greater than the 'A,' during the reset period of the buffer circuit 100. Therefore, when the buffer circuit 100 enters the activated period, the first output signal Q and the second output signal QB may keep the voltage level difference corresponding to the swing range of the buffer circuit 100. During the reset period, as the voltage level difference of the first output signal Q and the second output signal QB becomes greater, the buffer circuit 100 may differentially amplify the first output signal Q and the second output signal QB more promptly and more in synchronization with the clock signal CK.

Figure 7:
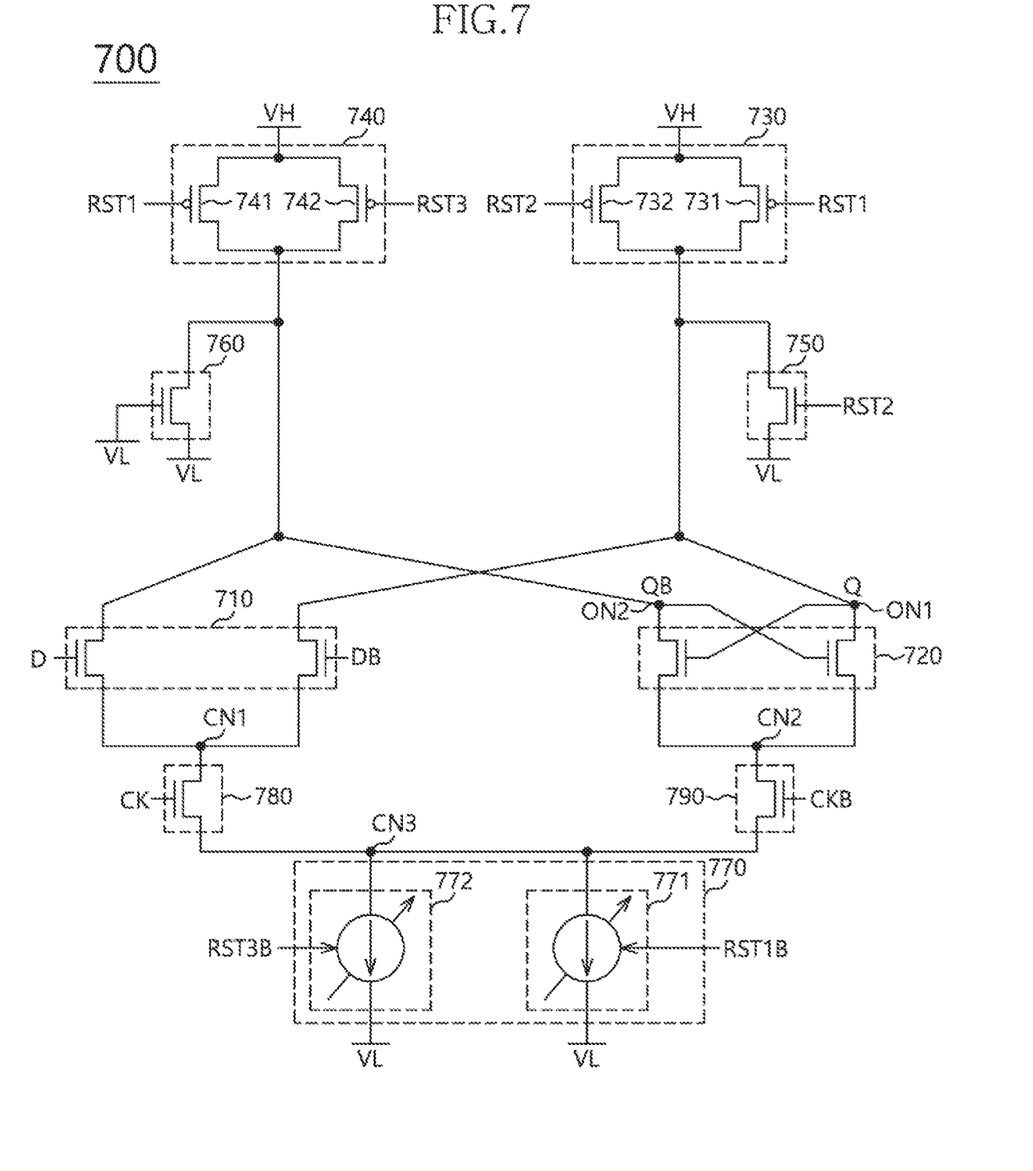
FIG. 7 shows a diagram illustrating a configuration of a buffer circuit, in accordance with an embodiment of the present disclosure.

FIG. 7 shows a diagram illustrating a configuration of a buffer circuit 700, in accordance with an embodiment of the present disclosure. Referring to FIG. 7, the buffer circuit 700 may operate during an activation period and a deactivation period. During the activation period, the buffer circuit 700 may operate in a high frequency mode and a low frequency mode. It may be determined based on the frequency of the clock signal CK whether the buffer circuit 700 is in the high frequency mode or the low frequency mode. The deactivation period may be the reset period. It may be preferable that the buffer circuit 700 operates with maximum power consumption in the high frequency mode. It may be preferable that the buffer circuit 700 operates relatively slowly with reduced power consumption in the low frequency mode. It may be preferable that the buffer circuit 700 consumes minimum power and keep a pair of output signals having a predetermined voltage level difference.

The buffer circuit 700 may be applied as the buffer circuit 100 of FIG. 1, and common elements are not described again here. Referring to FIG. 7, the buffer circuit 700 may include a first variable load 730, a second variable load 740, a reset circuit 750, and a variable current circuit 770. The first variable load 730 may receive a first reset signal RST1 and a second reset signal RST2 and may have a resistance value varying based on the first reset signal RST1 and the second reset signal RST2. The second variable load 740 may receive the first reset signal RST1 and a third reset signal RST3 and may have a resistance value varying based on the first reset signal RST1 and the third reset signal RST3. The first variable load 730 may include a first transistor 731 and a second transistor 732. The first transistor 731 and the second transistor 732 may be P-type channel MOS transistors. The first transistor 731 may receive the first reset signal RST1 at its gate, may be coupled to the first power voltage VH at its source, and may be coupled to the first output node ON1 at its drain. The second transistor 732 may receive the second reset signal RST2 at its gate, may be coupled to the first power voltage VH at its source, and may be coupled to the first output node ON1 at its drain. Each of the first transistor 731 and the second transistor 732 may work as a variable resistance. The second variable load 740 may include a third transistor 741 and a fourth transistor 742. The third transistor 741 and the fourth transistor 742 may be P-type channel MOS transistors. The third transistor 741 may receive the first reset signal RST1 at its gate, may be coupled to the first power voltage VH at its source, and may be coupled to the second output node ON2 at its drain. The fourth transistor 742 may receive the third reset signal RST3 at its gate, may be coupled to the first power voltage VH at its source, and may be coupled to the second output node ON2 at its drain. Each of the third transistor 741 and the fourth transistor 742 may work as a variable resistance.

In accordance with an embodiment of the present disclosure, the first transistor 731 may have greater size and/or less turn-on resistance value than the second transistor 732. In accordance with an embodiment of the present disclosure, the third transistor 741 may have greater size and/or less turn-on resistance value than the fourth transistor 742. In accordance with an embodiment of the present disclosure, the first transistor 731 may have the same size and/or the same turn-on resistance value as the third transistor 741. In accordance with an embodiment of the present disclosure, the second transistor 732 may have the same size and/or the same turn-on resistance value as the fourth transistor 742.

The reset circuit 750 may receive the second reset signal RST2. The reset circuit 750 may drive the first output node ON1 to the second power voltage VL based on the second reset signal RST2. The reset circuit 750 may be turned on and may drive the first output node ON1 to the second power voltage VL when the second reset signal RST2 is enabled. The reset circuit 750 may be turned off and might not drive the first output node ON1 to the second power voltage VL when the second reset signal RST2 is disabled.

The variable current circuit 770 may adjust the amount of current flowing from the third common node CN3 to the second power voltage VL terminal based on the first reset signal RST1 and the third reset signal RST3. For example, the variable current circuit 770 may receive the complementary signal RST1B of the first reset signal RST1 and the complementary signal RST3B of the third reset signal RST3. The variable current circuit 770 may include a first variable current source 771 and a second variable current source 772. The first variable current source 771 and the second variable current source 772 may be coupled in parallel between the third common node CN3 and the second power voltage VL. The first variable current source 771 may be turned on based on the complementary signal RST1B of the first reset signal RST1 and may allow current to flow from the third common node CN3 to the second power voltage VL when turned on. For example, the first variable current source 771 may be turned off when the first reset signal RST1 is enabled and may be turned on when the first reset signal RST1 is disabled. The second variable current source 772 may be turned on based on the complementary signal RST3B of the third reset signal RST3 and may allow current to flow from the third common node CN3 to the second power voltage VL when turned on. For example, the second variable current source 772 may be turned off when the third reset signal RST3 is enabled and may be turned on when the third reset signal RST3 is disabled.

The buffer circuit 700 may generate the second reset signal RST2 and the third reset signal RST3 based on the frequency of the dock signal CK and the first reset signal RST1. Although not illustrated, the buffer circuit 700 may further include a reset signal generation circuit configured to generate the second reset signal RST2 and the third reset signal RST3 based on the frequency of the dock signal CK and the first reset signal RST1. TABLE 1 below tabulates the enablement statuses of the first reset signal RST1, the second reset signal RST2, and the third reset signal RST3, according to the operation status of the buffer circuit 700. The operation of the buffer circuit 700 in accordance with an embodiment of the present disclosure is described hereinafter with reference to FIG. 7 and TABLE 1.

TABLE 1

| SIG./COMP. | HF MODE | LF MODE | RESET |
|---|---|---|---|
| RST1 | DISABLE | ENABLE | ENABLE |
| RST2 | DISABLE | DISABLE | ENABLE |
| RST3 | DISABLE | DISABLE | DISABLE or ENABLE |
| 731 | ON | OFF | OFF |
| 732 | ON | ON | OFF |
| 741 | ON | OFF | OFF |
| 742 | ON | ON | ON |
| 750 | OFF | OFF | ON |
| 771 | ON | OFF | OFF |
| 772 | ON | ON | ON or OFF |

In the high frequency mode ("HF MODE"), all of the first reset signal RST1, the second reset signal RST2, and the third reset signal RST3 may be disabled. All of the first transistor 731, the second transistor 732, the third transistor 741, and the fourth transistor 742 may be turned on according to the first reset signal RST1, the second reset signal RST2, and the third reset signal RST3. The first variable load 730 and the second variable load 740 may have the same resistance value and may provide first current to the first output node ON1 and the second output node ON2, respectively. The reset circuit 750 may be turned off according to the second reset signal RST2. The first variable current source 771 and the second variable current source 772 may receive the complementary signals RST1B and RST3B of the first reset signal RST1 and the third reset signal RST3 and may be turned off. Therefore, the variable current circuit 770 may allow fourth current to flow from the third common node CN3 to the second power voltage VL terminal. The reset circuit 750 and the dummy circuit 760 may be turned off. During the high-level period of the clock signal CK, the first enabling circuit 780 may be turned on. The amplifying circuit 710 may change the voltage levels of the first output node ON1 and the second output node ON2 based on the first input signal D and the second input signal DB. The second enabling circuit 790 may be turned on in the low-level period of the clock signal CK and/or the high-level period of the complementary clock signal CKB. The latch circuit 720 may keep the voltage levels of the first output node ON1 and the second output node ON2. The maximum amount of current may flow through the first variable load 730, the second variable load 740, and the variable current circuit 770. The buffer circuit 700 may generate the first output signal Q and the second output signal QB by performing amplification operation and latch operation on the first input signal D and the second input signal DB in synchronization with the clock signal CK having the high frequency, at the expense of the maximum power consumption.

In the low frequency mode ("LF MODE"), the first reset signal RST1 may be enabled to a high level and the second reset signal RST2 and the third reset signal RST3 may be turned off to a low level. The first transistor 731 and the third transistor 741 may be turned off and the second transistor 732 and the fourth transistor 742 may be turned on. Therefore, the first variable load 730 and the second variable load 740 may have the same resistance value and may provide second current to the first output node ON1 and the second output node ON2, respectively. The resistance value of the first variable load 730 and the second variable load 740 in the low frequency mode may be greater than the resistance value of the first variable load 730 and the second variable load 740 in the high frequency mode. The second current may be less than the first current. The reset circuit 750 may be turned off according to the second reset signal RST2. The first variable current source 771 may receive the complementary signal RST1B of the first reset signal RST1 and may be turned off. The variable current circuit 770 may allow fifth current to flow from the third common node CN3 to the second power voltage VL terminal. The fifth current may be less than the fourth current. The amplifying circuit 710 may change the voltage levels of the first output node ON1 and the second output node ON2 based on the first input signal D and the second input signal DB in the high-level period of the clock signal CK. The latch circuit 720 may keep the voltage levels of the first output node ON1 and the second output node ON2 during the low-level period of the clock signal CK. The first variable load 730 and the second variable load 740 may provide the first output node ON1 and the second output node ON2 with the second current, which is less than the first current, and the variable current circuit 770 may allow the fifth current, which is less than the fourth current, to flow. Therefore, the power consumption of the buffer circuit 700 may be reduced. Even when the power consumption of the buffer circuit 700 is reduced, the buffer circuit 700 may generate the first output signal Q and the second output signal QB by performing amplification operation and latch operation on the first input signal D and the second input signal DB in synchronization with the clock signal CK having the low frequency.

During the reset period ("RESET"), the first reset signal RST1 and the second reset signal RST2 may be enabled to a high level and the third reset signal RST3 may be turned off to a low level. The first transistor 731, the second transistor 732, and the third transistor 741 may be turned off, and the fourth transistor 742 may be turned on. Therefore, the first variable load 730 and the second variable load 740 may have different resistance values. The first variable load 730 may provide third current to the first output node ON1, and the second variable load 740 may provide the second current to the second output node ON2. The third current may be less than the second current and may be zero when the first transistor 731 and the second transistor 732 are completely turned off. That is, the current provided to the first output node ON1 through the first variable load 730 may be cut off. The first variable current source 771 may be turned off and the second variable current source 772 may be turned on. The variable current circuit 770 may allow the fifth current to flow from the third common node CN3 to the second power voltage VL terminal. The reset circuit 750 may be turned on according to the second reset signal RST2 and may drive the first output node ON1 to the second power voltage VL. The reset circuit 750 may drive the first output node ON1 to the second power voltage VL while the second variable load 740 provides the second current to the second output node ON2. Therefore, the buffer circuit 700 may keep the first output node ON1 and the second output node ON2 having a predetermined voltage level difference at the expense of the minimum power consumption during the reset period. In an embodiment, the third reset signal RST3 may be disabled during the reset period. When the third reset signal RST3 is disabled, the current provided to the second output node ON2 through the second variable load 740 may be cut off, and the current flowing from the third common node CN3 to the second power voltage VL terminal through the variable current circuit 770 may also be cut off. When the third reset signal RST3 is disabled in the reset period, the power consumption of the buffer circuit 700 may be further reduced.

Figure 8:
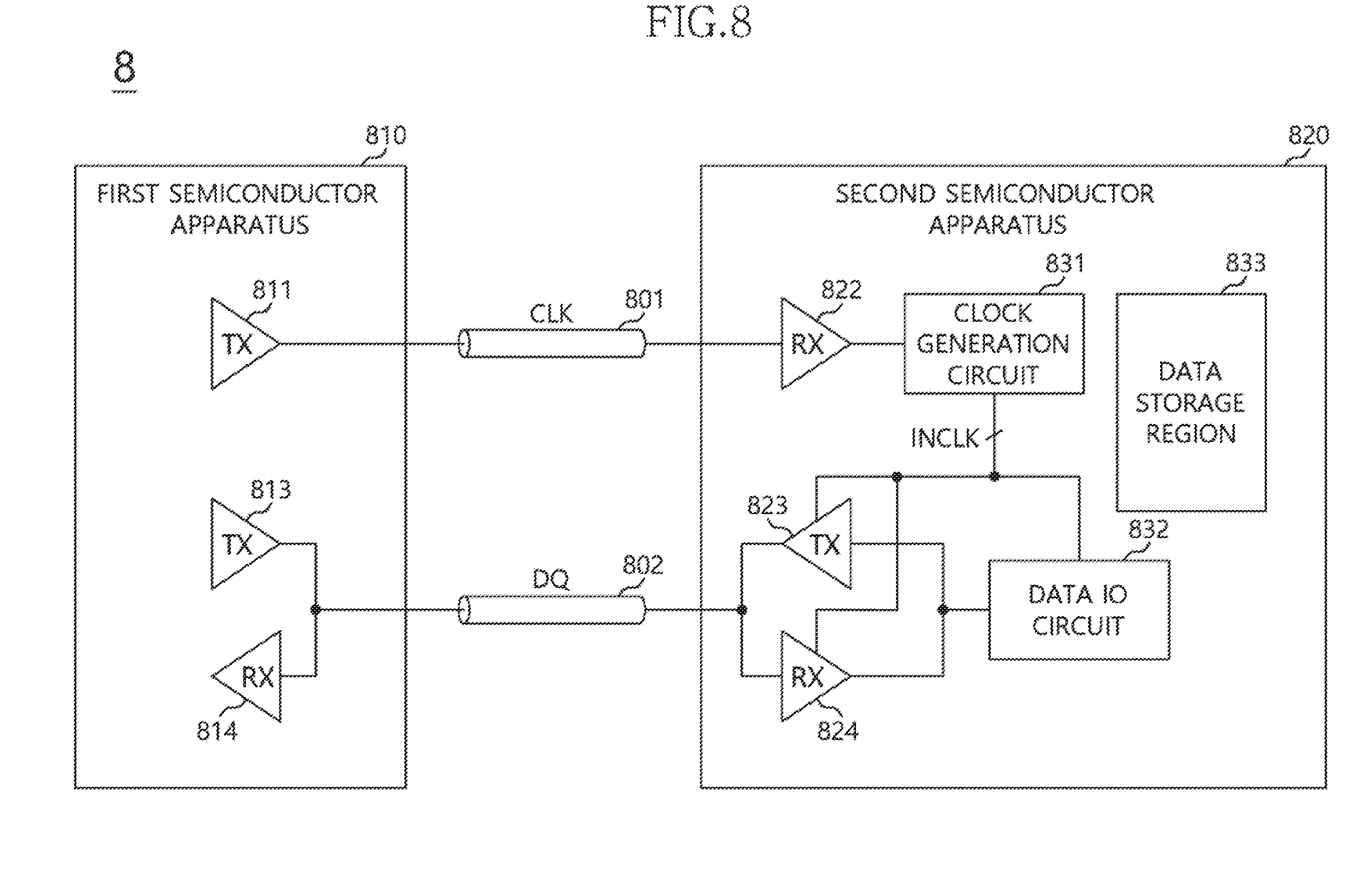
FIG. 8 shows a diagram illustrating a configuration of a semiconductor system, in accordance with an embodiment of the present disclosure.

FIG. 8 shows a diagram illustrating a configuration of a semiconductor system 8 in accordance with an embodiment of the present disclosure. The semiconductor system 8 may include a first semiconductor apparatus 810 and a second semiconductor apparatus 820. The first semiconductor apparatus 810 may provide various control signals required for the second semiconductor apparatus 820 to perform operations. The first semiconductor apparatus 810 may include various kinds of apparatuses. For example, the first semiconductor apparatus 810 may be a host apparatus, such as a central processing unit (CPU), a graphic processing unit (GPU), a multi-media processor (MMP), a digital signal processor, an application processor (AP), or a memory controller. The second semiconductor apparatus 820 may be a memory apparatus, and the memory apparatus may include a volatile memory and/or a non-volatile memory. The volatile memory may include a static RAM (SRAM), a dynamic RAM (DARM), or synchronous DRAM (SDRAM). The non-volatile memory may include a read only memory (ROM), a programmable ROM (PROM), an electrically erase and programmable ROM (EEPROM), an electrically programmable ROM (EPROM), a flash memory, a phase change RAM (PRAM), a magnetic RAM (MRAM), a resistive RAM (RRAM), or ferroelectric RAM (FRAM).

The second semiconductor apparatus 820 may be coupled to the first semiconductor apparatus 810 through a plurality of buses. The plurality of buses may be signal transmission paths, links, or channels. The plurality of buses may include a clock bus 801 and a data bus 802. The clock bus 801 may be unidirectional, and the data bus 802 may be bi-directional. The second semiconductor apparatus 820 may be coupled to the first semiconductor apparatus 810 through the clock bus 801 and may receive a clock signal CLK through the clock bus 801. The clock signal CLK may include one or more pairs of clocks. The second semiconductor apparatus 820 may be coupled to the first semiconductor apparatus 810 through the data bus 802 and may receive data DQ from the first semiconductor apparatus 810 through the data bus 802 or may provide data DQ to the first semiconductor apparatus 810 through the data bus 802. Although not illustrated, the plurality of buses may further include a command-address bus. The command-address bus may be unidirectional. The second semiconductor apparatus 820 may receive a command-address signal from the first semiconductor apparatus 810 through the command-address bus.

The first semiconductor apparatus 810 may include a clock transmitter 811, a data transmitter 813, and a data receiver 814. The clock transmitter 811 may provide a clock signal CLK, which is generated inside the first semiconductor apparatus 810, to the second semiconductor apparatus 820 through the clock bus 801. The clock transmitter 811 may provide the clock signal CLK to the second semiconductor apparatus 820 by driving the clock bus 801 based on the clock signal CLK, which is generated from a clock generation circuit (not illustrated), such as a phase locked loop. The data transmitter 813 may output internal data of the first semiconductor apparatus 810 as the data DQ. The data transmitter 813 may provide the data DQ to the second semiconductor apparatus 820 through the data bus 802. The data receiver 814 may receive data DQ provided by the second semiconductor apparatus 820 through the data bus 802.

The second semiconductor apparatus 820 may include a clock receiver 822, a data transmitter 823, and a data receiver 824. The clock receiver 822 may be coupled to the clock bus 801 and may receive the clock signal CLK, which is provided by the first semiconductor apparatus 810 through the clock bus 801. The data transmitter 823 may provide the data DQ to the first semiconductor apparatus 810. The data transmitter 823 may provide the data DQ to the first semiconductor apparatus 810 through the data bus 802. The data receiver 824 may receive data DQ provided by the first semiconductor apparatus 810 through the data bus 802.

The second semiconductor apparatus 820 may include a clock generation circuit 831, a data input/output (IO) circuit 832, and a data storage region 833. The clock generation circuit 831 may be coupled to the clock receiver 822 and may generate a plurality of internal clock signals INCLK based on the clock signal CLK provided through the clock receiver 822. The second semiconductor apparatus 820 may receive data DQ provided by the first semiconductor apparatus 810 and provide data DQ to the first semiconductor apparatus 810 in synchronization with the plurality of internal clock signals INCLK. The second semiconductor apparatus 820 may receive or sample data DQ provided through the data bus 802 based on the plurality of internal clock signals INCLK.

The data IO circuit 832 may generate internal data by receiving data DQ provided by the first semiconductor apparatus 810 through the data receiver 824 and may generate, based on the internal data, data DQ to be provided to the first semiconductor apparatus 810 through the data transmitter 823. The data IO circuit 832 may receive the plurality of internal clock signals INCLK generated from the clock generation circuit 831. The data IO circuit 832 may generate the data DQ from the internal data and may generate the internal data from the data DQ in synchronization with the plurality of internal clock signals INCLK. The internal data generated by the data IO circuit 832 may be stored in the data storage region 833. The data DQ may be generated, by the data IO circuit 832, from the internal data stored in the data storage region 833. The data storage region 833 may be a memory cell array including a plurality of memory cells. The data storage region 833 may include a plurality of bit lines (not illustrated) and a plurality of word lines (not illustrated) and may include a plurality of memory cells (not illustrated) coupled to cross points between the plurality of bit lines and the plurality of word lines. The clock dividing circuit 5 of FIG. 5, into which the buffer circuits 100 to 400 and 700 illustrated in FIGS. 1 to 4 and 7 are applied, may be included in the clock generation circuit 831 as an element of the clock generation circuit 831.

While certain embodiments have been described above, it will be understood by those of skill in the art that the described embodiments represent only a limited number of possible embodiments. Accordingly, the buffer circuit, the clock dividing circuit, and the semiconductor device using the same should not be limited based on the described embodiments. Rather, the buffer circuit, the clock dividing circuit, and the semiconductor device using the same should be construed in light of the claims that follow, taken in conjunction with the above description and accompanying drawings.

What is claimed is:

1. A buffer circuit comprising:
an amplifying circuit configured to change, based on a first input signal and a second input signal, voltage levels of a first output node and a second output node in a range between a first power voltage and a second power voltage;
a latch circuit configured to latch the voltage levels of the first output node and the second output node;
a first variable load configured to adjust, based on a reset signal, an amount of current provided by a first power voltage terminal at the first power voltage to the first output node;
a second variable load configured to adjust, based on the reset signal, an amount of current provided by the first power voltage terminal to the second output node; and
a reset circuit configured to drive the first output node to the second power voltage based on the reset signal.

2. The buffer circuit of claim 1,
wherein, during a reset period, an amount of current that the first variable load provides the first output node is different from an amount of current that the second variable load provides the second output node, and
wherein, outside the reset period, the amount of current that the first variable load provides the first output node is substantially the same as the amount of current the second variable load provides the second output node.

3. The buffer circuit of claim 1,
wherein the first variable load provides the first output node with a first current when the reset signal is in a disabled state and with a second current when the reset signal is in an enabled state, and
wherein the first current is greater than the second current.

4. The buffer circuit of claim 3,
wherein the second variable load provides the second output node with the first current when the reset signal is in the disabled state and with a third current when the reset signal is in the enabled state, and
wherein the third current is less than the first current and greater than the second current.

5. The buffer circuit of claim 1, wherein the reset circuit drives the first output node to the second power voltage when the reset signal is in an enabled state, and wherein the reset circuit is turned off when the reset signal is in a disabled state.

6. The buffer circuit of claim 1 further comprising a dummy circuit coupled to the second output node and having substantially the same loading as the reset circuit.

7. The buffer circuit of claim 1 further comprising:
a first enabling circuit coupled to the amplifying circuit and configured to provide the second power voltage to the amplifying circuit based on a clock signal; and
a second enabling circuit coupled to the latch circuit and configured to provide the second power voltage to the latch circuit based on the clock signal.

8. The buffer circuit of claim 1 further comprising a variable current circuit configured to adjust, based on the reset signal, an amount of current flowing from the amplifying circuit and the latch circuit to the second power voltage terminal.

9. The buffer circuit of claim 8,
wherein the variable current circuit allows a first amount of current to flow from the amplifying circuit and the latch circuit to the second power voltage terminal when the reset signal is in a disabled state,
wherein the variable current circuit allows a second amount of current to flow from the amplifying circuit and the latch circuit to the second power voltage terminal when the reset signal is in an enabled state, and
wherein the first amount of current is greater than the second amount of current.

10. A buffer circuit comprising: an amplifying circuit configured to change, based on a first input signal and a second input signal, voltage levels of a first output node and a second output node in a range between a first power voltage and a second power voltage;
a latch circuit configured to latch the voltage levels of the first output node and the second output node;
a first variable load coupled between a first power voltage terminal at the first power voltage and the first output node, wherein a resistance value of the first variable load varies based on a reset signal;
a second variable load coupled between the first power voltage terminal and the second output node, wherein a resistance value of the second variable load varies based on the reset signal; and
a reset circuit configured to drive the first output node to the second power voltage based on the reset signal.

11. The buffer circuit of claim 10,
wherein the resistance value of the first variable load is different from the resistance value of the second variable load during a reset period, and wherein the resistance value of the first variable load is substantially the same as the resistance value of the second variable load outside the reset period.

12. The buffer circuit of claim 10,
wherein the first variable load has a first resistance value when the reset signal is in a disabled state and a second resistance value when the reset signal is in an enabled state, and
wherein the first resistance value is less than the second resistance value.

13. The buffer circuit of claim 12,
wherein the second variable load has the first resistance value when the reset signal is in a disabled state and a third resistance value when the reset signal is in an enabled state, and
wherein the third resistance value is less than the second resistance value and greater than the first resistance value.

14. The buffer circuit of claim 10, wherein the reset circuit drives the first output node to the second power voltage when the reset signal is in an enabled state, and wherein the reset circuit is turned off when the reset signal is in disabled state.

15. The buffer circuit of claim 10 further comprising a dummy circuit coupled to the second output node and having substantially the same loading as the reset circuit.

16. The buffer circuit of claim 10 further comprising:
a first enabling circuit coupled to the amplifying circuit and configured to provide the second power voltage to the amplifying circuit based on a clock signal; and
a second enabling circuit coupled to the latch circuit and configured to provide the second power voltage to the latch circuit based on the clock signal.

17. The buffer circuit of claim 10 further comprising a variable current circuit configured to adjust, based on the reset signal, an amount of current flowing from the amplifying circuit and the latch circuit to the second power voltage terminal.

18. The buffer circuit of claim 17,
wherein the variable current circuit allows a first amount of current to flow from the amplifying circuit and the latch circuit to the second power voltage terminal when the reset signal is in a disabled state,
wherein the variable current circuit allows a second amount of current to flow from the amplifying circuit and the latch circuit to the second power voltage terminal when the reset signal is in enabled state, and
wherein the first amount of current is greater than the second amount of current.

19. A buffer circuit comprising:
an amplifying circuit configured to change, based on a first input signal and a second input signal, voltage levels of a first output node and a second output node in a range between a first power voltage and a second power voltage;
a latch circuit configured to latch the voltage levels of the first output node and the second output node;
a first variable load configured to adjust, based on a first reset signal and a second reset signal, an amount of current provided by a first power voltage terminal at the first power voltage to the first output node;
a second variable load configured to adjust, based on the first reset signal and a third reset signal, an amount of current provided by the first power voltage terminal to the second output node; and
a reset circuit configured to drive the first output node to the second power voltage based on the second reset signal.

20. The buffer circuit of claim 19,
wherein the first reset signal, the second reset signal, and the third reset signal are each disabled in a high frequency mode,
wherein the first variable load and the second variable load have substantially the same resistance value,
wherein the first variable load provides a first current to the first output node, and
wherein the second variable load provides the first current to the second output node.

21. The buffer circuit of claim 20,
wherein the first reset signal is enabled and the second and third reset signals are disabled in a low frequency mode,
wherein the first variable load and the second variable load have substantially the same resistance value,
wherein the first variable load provides a second current to the first output node,
wherein the second variable load provides the second current to the second output node, and
wherein the second current is less than the first current.

22. The buffer circuit of claim 21,
wherein the first and second reset signals are enabled and the third reset signal is disabled during a reset period,
wherein the second variable load has less resistance value than the first variable load,
wherein the first variable load provides a third current to the first output node,
wherein the second variable load provides the second current to the second node, and
wherein the third current is less than the second current.

23. The buffer circuit of claim 19 further comprising:
a first enabling circuit coupled to the amplifying circuit and configured to provide the second power voltage to the amplifying circuit based on a clock signal; and
a second enabling circuit coupled to the latch circuit and configured to provide the second power voltage to the latch circuit based on the clock signal.

24. The buffer circuit of claim 19 further comprising a variable current circuit configured to adjust, based on the first reset signal and the third reset signal, an amount of current flowing from the amplifying circuit and the latch circuit to the second power voltage terminal.

25. The buffer circuit of claim 24,
wherein the variable current circuit allows a fourth current to flow from the amplifying circuit and the latch circuit to the second power voltage terminal when the first reset signal and the third reset signal are disabled during a high frequency mode,
wherein the variable current circuit allows fifth current to flow from the amplifying circuit and the latch circuit to the second power voltage terminal when the first reset signal is enabled and the third reset signal is disabled during one of a low frequency mode and a reset period, and
wherein the fifth current is less than the fourth current.

26. The buffer circuit of claim 24, wherein the variable current circuit cuts off current flowing from the amplifying circuit and the latch circuit to the second power voltage terminal during a reset period when the first reset signal and the third reset signal are enabled.

27. The buffer circuit of claim 1, wherein the buffer circuit keeps the first output node and the second output node having different voltage levels when the buffer circuit is reset based on the reset signal.

* * * * *